US012237337B2

United States Patent
Oh et al.

(10) Patent No.: US 12,237,337 B2
(45) Date of Patent: Feb. 25, 2025

(54) DISPLAY DRIVER SEMICONDUCTOR DEVICE AND METHOD FOR MANUFACTURING THE SAME

(71) Applicant: SK keyfoundry Inc., Cheongju-si (KR)

(72) Inventors: Boseok Oh, Cheongju-si (KR); Kwangho Park, Cheongju-si (KR); Jiman Kim, Cheongju-si (KR); Taekyun Yoo, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 718 days.

(21) Appl. No.: 17/511,884

(22) Filed: Oct. 27, 2021

(65) Prior Publication Data

US 2022/0336502 A1    Oct. 20, 2022

(30) Foreign Application Priority Data

Apr. 15, 2021   (KR) .......................... 10-2021-0049363

(51) Int. Cl.
*H01L 29/66*   (2006.01)
*H01L 27/12*   (2006.01)
(Continued)

(52) U.S. Cl.
CPC ...... *H01L 27/1237* (2013.01); *H01L 27/1259* (2013.01); *H01L 29/66734* (2013.01);
(Continued)

(58) Field of Classification Search
CPC ........... H01L 29/7813; H01L 29/66734; H01L 27/1237–1259
See application file for complete search history.

(56) References Cited

U.S. PATENT DOCUMENTS 10,381,460 B2   8/2019  Ryu et al.
2007/0273001 A1  11/2007  Chen et al.
(Continued)

FOREIGN PATENT DOCUMENTS

KR   10-2011-0117326 A   10/2011
KR   10-2014-0057725 A    5/2014
(Continued)

OTHER PUBLICATIONS

Korean Office Action issued on Mar. 31, 2022, in counterpart Korean Patent Application No. 10-2021-0049363 (5 pages in English, 5 pages in Korean).

*Primary Examiner* — Hoa B Trinh
(74) *Attorney, Agent, or Firm* — NSIP Law

(57) ABSTRACT

A first high voltage semiconductor element, disposed in a substrate, includes first trenches; a first source region and a first drain region; first drift regions having respective ones partially surround the first source region and the first drain region; a first gate insulating layer and a first gate electrode disposed between the first drift regions; and a first high voltage well surrounding the first drift regions. A second high voltage semiconductor element, disposed in the substrate, includes second trenches; a second source region and a second drain region; second drift regions having respective ones partially surround the second source region and the second drain region; a second gate insulating layer and a second gate electrode disposed between the second drift regions; and a second high voltage well surrounding the second drift regions. Depths of the second trenches are disposed to be greater than depths of the first trenches.

25 Claims, 12 Drawing Sheets

(51) Int. Cl.
*H01L 29/78* (2006.01)
*G09G 3/32* (2016.01)

(52) U.S. Cl.
CPC ........... *H01L 29/7813* (2013.01); *G09G 3/32* (2013.01); *G09G 2330/028* (2013.01)

(56) References Cited

U.S. PATENT DOCUMENTS

2008/0073745 A1\* 3/2008 Tang ................. H01L 21/84
257/500
2011/0042756 A1 2/2011 Hikida
2014/0284712 A1\* 9/2014 Ujiie .................... H01L 21/761
438/286

FOREIGN PATENT DOCUMENTS

KR 10-1822016 B1 1/2018
KR 10-2057340 B1 12/2019
KR 10-2020-0110020 A 9/2020

\* cited by examiner (a)

(b)

(c)

(a)

(b)

DISPLAY DRIVER SEMICONDUCTOR DEVICE AND METHOD FOR MANUFACTURING THE SAME

CROSS-REFERENCE TO RELATED APPLICATIONS

This application claims the benefit under 35 USC 119(a) of Korean Patent Application No. 10-2021-0049363 filed on Apr. 15, 2021, in the Korean Intellectual Property Office, the entire disclosure of which is incorporated herein by reference for all purposes.

BACKGROUND

1. Field

The following description relates to a display driver semiconductor device and method for manufacturing the same.

2. Description of Related Art

In the field of a display, a source driver performs a function of converting a digital signal corresponding to image data into an analog voltage. When a pulse is applied to each pixel by a gate driver, the converted analog voltage is supplied to each pixel of a display panel and an image is displayed.

In recent years, as demand for bezel-less displays increases, active research is being conducted to convert the source driver and the gate driver into one chip.

Meanwhile, when the source driver and the gate driver are implemented as one chip, a source semiconductor element for driving the source driver and a gate semiconductor element for driving the gate driver are integrated into one chip (or die) to form a semiconductor device.

Such a semiconductor device requires an element isolation layer that electrically isolates semiconductor elements having different operating voltages. The element isolation layer has different shapes depending on the operating voltage of the semiconductor element.

That is, the element isolation layer of the source semiconductor element and the element isolation layer of the gate semiconductor element have different shapes, and therefore, a manufacturing process of the source semiconductor element and a manufacturing process of the gate semiconductor element had to be separately performed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a first high voltage semiconductor element and a second high voltage semiconductor element. The first high voltage semiconductor element, disposed in a substrate, includes first trenches; a first source region and a first drain region; first drift regions having respective ones partially surround the first source region and the first drain region; a first gate insulating layer and a first gate electrode disposed between the first drift regions; and a first high voltage well surrounding the first drift regions. The second high voltage semiconductor element, disposed in a substrate, includes second trenches; a second source region and a second drain region; second drift regions having respective ones partially surround the second source region and the second drain region; a second gate insulating layer and a second gate electrode disposed between the second drift regions; and a second high voltage well surrounding the second drift regions. A depth of a second trench of the second trenches is greater than a depth of a first trench of the first trenches.

A gate driver IC may include the first high voltage semiconductor element, a source driver IC may include the second high voltage semiconductor element, and the gate driver IC and the source driver IC may be formed as one chip.

A dual depth trench, having a first depth and a second depth, may be disposed in a contact region between the first high voltage semiconductor element and the second high voltage semiconductor element. The first depth and the depth of the first trench may be equal, and the second depth and the depth of the second trench may be equal.

The first trenches may include a first shallow trench and a second shallow trench overlapping the first gate electrode, the first shallow trench may be disposed between the first source region and the first gate electrode, the second shallow trench may be disposed between the first drain region and the first gate electrode, and the depth of the first trench may be shallower than a depth of the first drift region.

The second trenches may surround the second drift regions, and the depth of the second trench may be greater than a depth of the second drift region.

A depth of the first high voltage well may be greater than a depth of the second high voltage well, and a thickness of the first gate insulating layer may be wider than a thickness of the second gate insulating layer.

The second high voltage semiconductor element may further include a high voltage deep well under the second high voltage well.

The first trenches may include a first shallow trench and a second shallow trench overlapping the first gate electrode, the first shallow trench may be disposed between the first source region and the first gate electrode, the second shallow trench may be disposed between the first drain region and the first gate electrode. The first drift regions may include a first deep drift region and a second deep drift region overlapping the first gate electrode, the first deep drift region may partially surround the first source region and the first shallow trench, and the second deep drift region may partially surround the first drain region and the second shallow trench.

The semiconductor device may further include a low voltage semiconductor element disposed on the substrate. The low voltage semiconductor element may include: a third source region and a third drain region disposed in the substrate; a third gate insulating layer and a third gate electrode disposed between the third source region and the third drain region; a low voltage well partially surrounding the third source region and the third drain region; and third trenches disposed in the substrate. A depth of a third trench of the third trenches may be shallower than the depth of the second trench, and may be equal to the depth of the first trench.

A dual depth trench, having a first depth and a second depth, may be disposed in a contact region between the second high voltage semiconductor element and the low voltage semiconductor element. The first depth may be equal to the depth of the third trench, and the second depth may be equal to the depth of the second trench.

The first trenches may include a first shallow trench and a second shallow trench overlapping the first gate electrode, the first drift regions may include a first deep drift region and a second deep drift region overlapping the first gate electrode, one side of the first gate electrode may overlap the first shallow trench and the first deep drift region, and another side of the first gate electrode may overlap the second shallow trench and the second deep drift region.

One side of the first gate insulating layer may be disposed in direct contact with the first shallow trench and the first deep drift region, and another side of the first gate insulating layer may be disposed in direct contact with the second shallow trench and the second deep drift region.

In another general aspect, a method for manufacturing a semiconductor device, includes forming a first high voltage well in a first region of a substrate; forming first drift regions in the first high voltage well; forming first trenches in the first drift regions; forming, in a second region of the substrate, second trenches with depths greater than depths of the first trenches; forming a second high voltage well in the second region; forming second drift regions in the second high voltage well; forming first and second gate insulating layers on the first and second high voltage wells, respectively; forming first and second gate electrodes on the first and second gate insulating layers, respectively; forming a first source region and a first drain region on corresponding ones of the first drift regions; and forming a second source region and a second drain region on corresponding ones of the second drift regions.

A gate driver IC may include a first high voltage semiconductor element disposed in the first region, a source driver IC may include a second high voltage semiconductor element disposed in the second region, and the gate driver IC and the source driver IC may be disposed as one chip.

A dual depth trench, having a first depth and a second depth, may be disposed in a contact region between the first region and the second region, the first depth and the depth of the first trench may be equal, and the second depth and the depth of the second trench may be equal.

A depth of the first high voltage well may be greater than a depth of the second high voltage well.

The method may further include forming a high voltage deep well before the forming of the second high voltage well.

The method may further include forming a low voltage semiconductor element on the substrate. The forming a low voltage semiconductor element may include forming third trenches in the substrate; forming a low voltage well in the substrate; forming a third gate insulating layer and a third gate electrode on the low voltage well; and forming a third source region and a third drain region in the low voltage well. Depths of the third trenches may be shallower than the depths of the second trenches.

The first trenches may include a first shallow trench and a second shallow trench overlapping the first gate electrode, the first drift regions may include a first deep drift region and a second deep drift region overlapping the first gate electrode, one side of the first gate electrode overlaps the first shallow trench and the first deep drift region, and another side of the first gate electrode overlaps the second shallow trench and the second deep drift region.

One side of the first gate insulating layer may be disposed in direct contact with the first shallow trench and the first deep drift region, and another side of the first gate insulating layer may be disposed in direct contact with the second shallow trench and the second deep drift region.

In another general aspect, a semiconductor device, includes semiconductor elements, serially disposed in a substrate, each comprising: a source region adjacently disposed to a drain region; a gate insulating layer disposed on each of the semiconductor elements; a gate electrode disposed on the gate insulating layer; and trenches disposed in each of the semiconductor elements. The trenches in adjacent ones of the semiconductor elements have different depths.

Voltages of the semiconductor elements may be different from each other.

The semiconductor device may further include first drift regions in a first semiconductor element of the semiconductor elements. The first drift regions may have respective ones partially surround the source region and the drain region of the first semiconductor element.

The semiconductor device may further include second drift regions in a second semiconductor element of the semiconductor elements. The second drift regions may have respective ones partially surrounding the source region and the drain region of the second semiconductor element.

The gate insulating layer of the first semiconductor element may overlap the trenches in the first semiconductor element.

The gate insulating layer of the second semiconductor element may be disposed between the trenches in the second semiconductor element.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
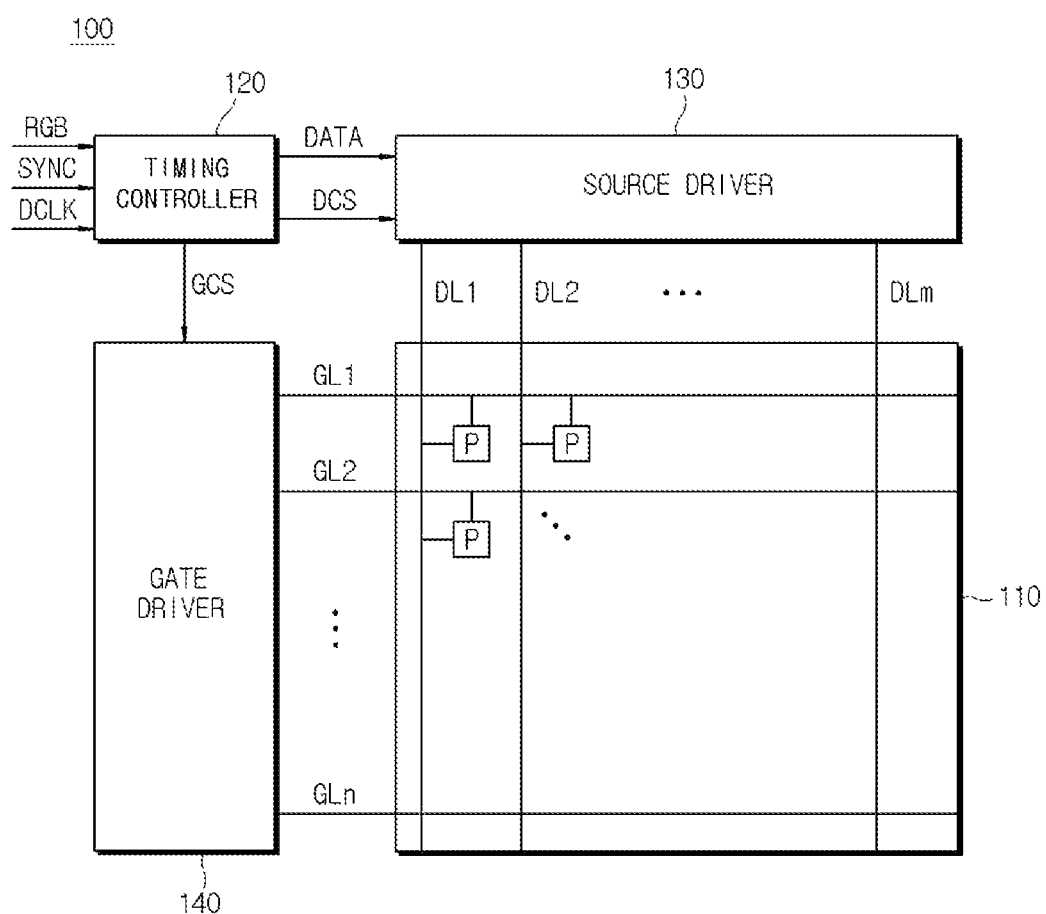
FIG. 1 conceptually shows a display device according to one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

A suffix "module" or "part" for the component, which is used in the following description, is given or mixed in consideration of only convenience for ease of specification, and does not have any distinguishing meaning or function per se. Also, the "module" or "part" may mean software components or hardware components such as a field programmable gate array (FPGA), an application specific integrated circuit (ASIC). The "part" or "module" performs certain functions. However, the "part" or "module" is not meant to be limited to software or hardware. The "part" or "module" may be configured to be placed in an addressable storage medium or to restore one or more processors. Thus, for one example, the "part" or "module" may include components such as software components, object-oriented software components, class components, and task components, and may include processes, functions, attributes, procedures, subroutines, segments of a program code, drivers, firmware, microcode, circuits, data, databases, data structures, tables, arrays, and variables. Components and functions provided in the "part" or "module" may be combined with a smaller number of components and "parts" or "modules" or may be further divided into additional components and "parts" or "modules".

Methods or algorithm steps described relative to some embodiments may be directly implemented by hardware and software modules that are executed by a processor or may be directly implemented by a combination thereof. The software module may be resident on a RAM, a flash memory, a ROM, an EPROM, an EEPROM, a resistor, a hard disk, a removable disk, a CD-ROM, or any other type of record medium known to those skilled in the art. A record medium is coupled to a processor and the processor can read information from the record medium and can record the information in a storage medium. In another way, the record medium may be integrally formed with the processor. The processor and the record medium may be resident within an application specific integrated circuit (ASIC). The ASIC may be resident within a user's terminal.

Also, in the following description of one or more embodiments disclosed in the present specification, the detailed description of known technologies incorporated herein is omitted to avoid making the subject matter of one or more embodiments disclosed in the present specification unclear. Also, the accompanied drawings are provided only for more easily describing one or more embodiments disclosed in the present specification. The technical spirit disclosed in the present specification is not limited by the accompanying drawings. All modification, equivalents and substitutes included in the spirit and scope are understood to be included in the accompanying drawings.

FIG. 1 conceptually shows a display device according to one or more embodiments.

Referring to FIG. 1, the display device 100 may include a display panel 110, a timing controller 120, a source driver IC 130, and a gate driver IC 140. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

According to one or more embodiments, the display device 100 may be a device capable of displaying an image or video. For example, the display device 100 may mean a device capable of displaying an image or video in a TV, smartphone, tablet PC, mobile phone, video phone, e-book reader, computer, camera, wearable device, etc. However, the display device 100 is not limited thereto.

The display panel 110 may include a plurality of subpixels P arranged in rows and columns. For example, the display panel 110 may be implemented as a light-emitting diode (LED) display, an organic LED (OLED) display, an active-matrix OLED (AMOLED) display, an electrochromic display (ECD), a digital mirror device (DMD), an actuated mirror device (AMD), a grating light valve (GLV), a plasma display panel (PDP), an electroluminescent display (ELD), and a vacuum fluorescent display (VFD). However, the display panel 110 is not limited thereto.

The display panel 110 includes a plurality of gate lines GL1 to GLn arranged in rows (n is a natural number), a plurality of data lines DL1 to DLm arranged in columns (m is a natural number), and subpixels P formed at intersections of the plurality of gate lines GL1 to and the plurality of data lines DL1 to DLm. In addition, the display panel 110 includes a plurality of horizontal lines, and one horizontal line is composed of subpixels P connected to one gate line. During one horizontal time H, the subpixels arranged in one horizontal line may be driven, and during the next 1H time, the subpixels arranged in another horizontal line may be driven.

According to one or more embodiments, the subpixels P may include a light-emitting diode (LED) and a diode driving circuit that independently drives the light-emitting diode. For example, the diode driving circuit may be connected to one gate line and one data line. The light-emitting diode may be connected between the diode driving circuit and a power supply voltage (e.g., a ground voltage).

The diode driving circuit may include a switching element connected to the gate lines GL1 to GLn, for example, a thin film transistor (TFT). When a gate-ON signal is applied from the gate lines GL1 to GLn and the switching element is turned on, the diode driving circuit can provide an image signal (also referred to as a pixel signal) received from the data lines DL1 to DLm connected to the diode driving circuit to the light-emitting diode. The light-emitting diode may output an optical signal corresponding to the image signal.

Each of the subpixels P may be one of a red element R that outputs red light, a green element G that outputs green light, and a blue element B that outputs blue light. In the display panel 110, the red, green, and blue elements may be arranged in various ways. According to one or more embodiments, the subpixels P of the display panel 110 may be repeatedly arranged in the order of R, G, B, and G or B, G, R, and G, and the like. For example, the pixels of the display panel 110 may be arranged according to an RGB stripe structure or an RGB pentile structure. However, the pixels are not limited thereto.

The gate driver IC 140 may sequentially provide the gate-ON signal to the plurality of gate lines GL1 to GLn in response to a gate control signal GCS. For example, the gate control signal GCS may include a gate start pulse that instructs the start of the gate-ON signal output, a gate shift clock that controls the gate-ON signal's output time point, etc.

When the gate start pulse is applied, the gate driver IC 140 may generate the gate-ON signal (e.g., a logic high gate voltage) sequentially in response to the gate shift clock, and may provide the gate-ON signal to the plurality of gate lines GL1 to GLn sequentially. Here, during a time period in which the gate-ON signal is not provided to the plurality of gate lines GL1 to GLn, a gate-OFF signal (e.g., a logic low gate voltage) is provided to the plurality of gate lines GL1 to GLn.

The source driver IC 130 may convert a digital image data DATA into analog image signals in response to a data control signal DCS and may provide the converted image signals to the plurality of data lines DL1 to DLm. The source driver IC 130 may provide the image signal corresponding to one horizontal line to the plurality of data lines DL1 to DLm during one horizontal time 1H.

The timing controller 120 may receive a video image data RGB from the outside, perform image processing on the video image data RGB or convert the video image data RGB to fit the structure of the display panel 110, and then generate the digital image data DATA. In addition, the timing controller 120 may transmit the digital image data DATA to the source driver IC 130.

The timing controller 120 may receive a plurality of control signals from an external host device. The control signals may include a horizontal synchronization signal Hsync, a vertical synchronization signal Vsync, and a clock signal DCLK.

The timing controller 120 may generate the gate control signal GCS and the data control signal DCS for controlling the gate driver IC 140 and the source driver IC 130 based on the received control signals. The timing controller 120 may control various operation timings of the gate driver IC 140 and the source driver IC 130 based on the gate control signal GCS and the data control signal DCS.

According to one or more embodiments, the timing controller 120 may control the gate driver IC 140 based on the gate control signal GCS such that the gate driver IC 140 drives the plurality of gate lines GL1 to GLn. The timing controller 120 may control the source driver IC 130 on the basis of the data control signal DCS such that the source driver IC 130 provides the image signals to the plurality of plurality of data lines DL1 to DLm.

Although the timing controller 120, the source driver IC 130, and the gate driver IC 140 are shown as separate modules in one or more embodiments of FIG. 1, they can also be manufactured by being integrated into a single display driver IC. Therefore, the present disclosure is characterized by a source semiconductor element for driving the source driver IC 130, and a gate semiconductor element for driving the gate driver IC 140 are integrated into a single display driver IC through a single process. This will be described below in more detail.

Figure 2:
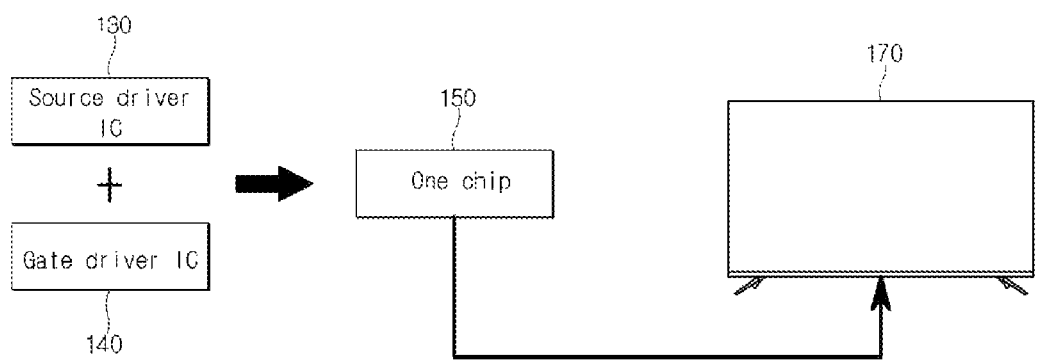
FIG. 2 shows an example in which a source-gate drive IC is manufactured with one semiconductor IC and applied to the display device according to one or more embodiments.

FIG. 2 shows a bezel-less display according to one or more embodiments.

For example, a semiconductor IC 150 obtained by combining the source driver IC and the gate driver IC into one can be used in a bezel-less TV 170. However, the bezel-less TV 170 may not have enough space to put ICs thereinto, so it may be desirable to put the ICs together to the lower portion of the screen. Conventionally, the gate driver IC 140 (a GHV device) and the source driver IC 130 (a SHV device) are arranged alternately. However, in the present disclosure, the gate driver IC 140 and the source driver IC 130 can be formed on one wafer. Therefore, the gate driver IC 140 and the source driver IC 130 do not exist as two chips but can be manufactured as one chip 150 on one semiconductor substrate. Thus, the size of the chip and the package cost can be reduced.

Figure 3:
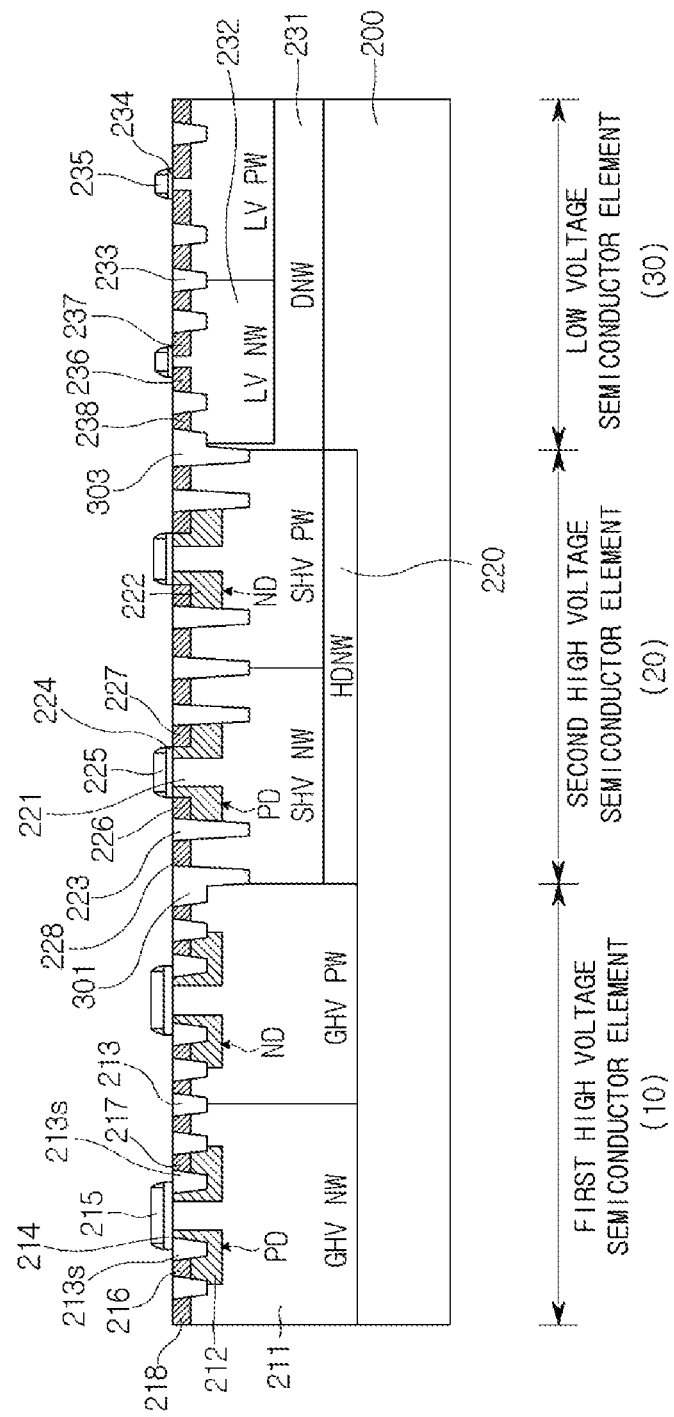
FIG. 3 is a cross-sectional view of a semiconductor device according to one or more embodiments.

FIG. 3 is a cross-sectional view of a semiconductor device according to one or more embodiments.

Referring to FIG. 3, a semiconductor substrate 200 comprises a first region, a second region, and a third region. A first high voltage semiconductor element 10 may be positioned in the first region, and a second high voltage semiconductor element 20 may be positioned in the second region. A low voltage semiconductor element 30 may be positioned in the third region.

For example, the first high voltage semiconductor element 10 (or a GHV element) may be the gate driver IC 140 and may include a high voltage semiconductor element of 40 V or higher as a semiconductor element for driving the gate lines.

The second high voltage semiconductor element 20 (or a SHV device) may be the source driver IC 130 and may include a high voltage semiconductor element of 9 V or higher as a semiconductor element for driving the data lines.

The low voltage semiconductor element 30 (or a LV device) 30 implements a logic element that controls the gate driver or the source driver. The low voltage semiconductor element 30 may include a low voltage (LV) semiconductor element 30 of lower than 5 V. In this case, the low voltage semiconductor element 30 may operate together with the first high voltage semiconductor element 10 or may operate together with the second high voltage semiconductor element 20.

Also, the low voltage semiconductor element 30 may include an element that operates at one or more operating voltages. For example, the low voltage semiconductor element 30 may include two elements that operate at an operating voltage of 1.2 V or 1.8 V. That is, in a case where the LV semiconductor element having an operating voltage of 1.2 V is used, when noise comes from the outside in the power line, there is a possibility that malfunction occurs due to the very low operating voltage. In this case, the semiconductor element may accept 1.8 V first, and the inside of the element may be driven at 1.2 V.

The first high voltage semiconductor element 10 may include a first high voltage well 211, a first drift region 212, a first trench 213s, a first gate insulating layer 214, a first gate electrode 215, and a first source region 216, a first drain region 217, and a first well tab 218.

The first high voltage well 211 may include a high voltage P-type well region GHV PW and a high voltage N-type well region GHV NW. The high voltage P-type well region GHV PW is doped with P-type impurities and may include a number of holes, whereas the high voltage N-type well region GHV NW is doped with N-type impurities and may include a number of electrons.

According to one or more embodiments, the depth of the first high voltage well 211 may be greater than the depth of wells 221 and 231 formed in the second region or the third region. This is because the semiconductor element formed in the first high voltage well 211 is manufactured at a higher temperature than a temperature at which the semiconductor element formed in the second region or in the third region. This will be described in more detail in the following manufacturing method.

Also, according to one or more embodiments, a plurality of the first drift regions 212 for mitigating an electric field of a high concentration doped region may be formed in the first high voltage well 211. For example, a pair of N-type low concentration first drift regions ND may be formed in the high voltage P-type well region GHV PW, and in contrast, another pair of P-type low concentration first drift region PD may be formed in the high voltage N-type well region GHV NW.

The first gate insulating layer 214 and the first gate electrode 215 are positioned to overlap between the first drift regions 212 on the semiconductor substrate 200, and the first high voltage well 211 under the first gate insulating layer 214 and the first gate electrode 215 may form a channel region. According to one or more embodiments, the thickness of the first gate insulating layer 214 may be larger than the thickness of the gate insulating layer formed in the second region or in the third region.

Also, after the first gate insulating layer 214 and the first gate electrode 215 are formed, a lightly doped drain (LDD) region may be formed. The LDD region may be formed in the vicinity of the first source region 216 and the first drain region 217, and can reduce the leakage current of the first high voltage semiconductor element.

The first source region 216 and the first drain region 217 may be formed on each of both sides of the first gate electrode 215 of the first high voltage semiconductor element 10. The first trench 213s (left) may be formed between the first source region 216 and the first gate electrode 215. Also, the first trench 213s (right) may be formed between the first drain region 217 and the first gate electrode 215. Since the first high voltage semiconductor element 10 operates at 40 V or higher, the first trenches 213s may be required between the first source region 216 and the first gate electrode 215 and between the first drain region 217 and the first gate electrode 215 in order to protect the first thin gate insulating layer 214, respectively. An insulating material such as an oxide layer may be filled in the first trench 213s.

Also, according to one or more embodiments, the first high voltage semiconductor element 10 in the first region may include an additional first trench 213 for the isolation between elements. The first trench 213 may be positioned in a plurality of isolation regions on the semiconductor substrate 200 to isolate the semiconductor elements, and may preferably have a short trench isolation (STI) structure. According to one or more embodiments, the depth of the first trench 213 may be 0.3 um to 0.5 um.

Also, according to one or more embodiments, the first well tab 218 may be formed on a surface of the first high voltage well 211 on which the first drift region 212 is not formed. The first well tab 218 may reduce resistance of the first high voltage well 211 and may serve to apply a bias voltage or a ground voltage to the first high voltage well 211. The first well tab 218 may have the same conductivity type as the first high voltage well 211 thereunder and may have a higher impurity doping concentration than that of the first high voltage well 211.

Referring to FIG. 3, the second high voltage semiconductor element 20 may include a second high voltage deep well 220, a second high voltage well 221, a second drift region 222, a second trench 223, and a second gate insulating layer 224, a second gate electrode 225, a second source region 226, a second drain region 227, and a second well tab 228.

The second high voltage deep well HDNW 220 is doped with N-type impurities and may electrically isolate the second high voltage semiconductor element 20 from the substrate, thereby advantageously assisting in determining an operational voltage. For example, in the absence of the second high voltage deep well 220, the high voltage P-type well region GHV PW of the first high voltage semiconductor element 10 and a high voltage P-type well region SHV PW of the second high voltage semiconductor element 20 may be electrically connected to each other through the substrate. In this case, the operational voltage of the first high voltage semiconductor element 10 and the operational voltage of the second high voltage semiconductor element 20 cannot be different from each other. However, if the second high voltage deep well HDNW 220 is disposed under the high voltage P-type well region SHV PW of the second high voltage semiconductor element 20, the high voltage P-type well region GHV PW of the first high voltage semiconductor element 10 and the high voltage P-type well region SHV PW of the second high voltage semiconductor element 20 are electrically isolated from each other, so that a desired operational voltage can be determined. It can also be easier to set a back bias.

The second high voltage well 221 may be formed in the second high voltage deep well HDNW 220. The second high voltage well 221 comprises the high voltage P-type well region SHV PW and a high voltage N-type well region SHV NW. The high voltage P-type well region SHV PW is doped with P-type impurities and includes a number of holes, whereas the high voltage N-type well region SHV NW is doped with N-type impurities and includes a number of electrons.

A plurality of the second drift regions 222 for mitigating an electric field of a high concentration doped region may be formed in the second high voltage well 221. For example, a pair of N-type low concentration second drift regions ND 222 may be formed in the high voltage P-type well region SHV PW, and in contrast, another pair of P-type low concentration second drift region PD 222 may be formed in the high voltage N-type well region SHV NW.

The second gate insulating layer 224 and the second gate electrode 225 are formed between the second drift regions 222 on the semiconductor substrate 200, and the second high voltage well 221 under the second gate insulating layer 224 and the second gate electrode 225 forms a channel region. Here, the second gate electrode 225 is formed to overlap the plurality of second drift regions 222.

After the second gate insulating layer 224 and the second gate electrode 225 are formed, a lightly doped drain (LDD) region may be formed. The LDD region may be formed in the vicinity of the second source region 226 and the second drain region 227 and can reduce the leakage current of the second high voltage semiconductor element 20.

Also, the second source region 226 and the second drain region 227 may be formed on both sides of the second gate electrode 225, respectively. The second source region 226 and the second drain region 227 may be formed in the second drift region 222.

Also, according to one or more embodiments, the second high voltage semiconductor element 20 in the second region may include at least one second trench 223. The second trench 223 may be positioned in a plurality of isolation regions on the semiconductor substrate 200 to isolate the semiconductor elements, and may preferably have a medium trench isolation (MTI) structure. The depth of the second trench 223 is in a range of 0.6 um to 3 um, and may be greater than the depth of the first trench 213. For the isolation between elements, an insulating material such as an oxide layer may be filled in the second trench 223. The second trench 223 may be formed in contact with the second source region 226, the second drain region 227, and the plurality of second drift regions 222.

Also, according to one or more embodiments, the second well tab 228 may be formed on a surface of the second high voltage well 221 on which the second drift region 222 is not formed. The second well tab 228 may reduce the resistance of the second high voltage well 221 and may serve to apply a bias voltage or a ground voltage to the second high voltage well 221. The second well tab 228 may have the same conductivity type as that of the second high voltage well 221 thereunder, and may have a higher impurity doping concentration than that of the second high voltage well 221.

Referring to FIG. 3, the low voltage semiconductor element 30 may include a low voltage deep well DNW 231, a low voltage well 232, a third trench 233, a third gate insulating layer 234, a third gate electrode 235, a third source region 236, a third drain region 237, and a third well tab 238.

The low voltage deep well DNW 231 may block a noise from the first high voltage semiconductor element (GHV element) 10 to the low voltage semiconductor element 30. For example, if the low voltage wells (LV NW and LV PW) 232 are formed without the low voltage deep well (DNW) 231 in the low voltage (LV) region, the semiconductor substrate 200 thereunder and the low voltage well (LV PW) 232 are connected, as a result, the low voltage well (LV PW) 232 is electrically connected to the first high voltage well (GHV PW) 211 of the first high voltage semiconductor element 10. Therefore, when the chip is actually driven, noise at the potential of the first high voltage well (GHV PW) 211 of the first high voltage semiconductor element 10 may affect the low voltage well (LV PW) region. Thus, when used together with the first high voltage semiconductor element 10, it may be desirable to form the low voltage deep well (DNW) 231 in a region where the low voltage (LV) semiconductor element 30 is formed.

Also, the low voltage well 232 may be formed in the low voltage deep well 231, and the low voltage well 232 may be composed of a low voltage P-type well region LV PW and a low voltage N-type well region LV NW. The low voltage P-type well region LV PW is doped with P-type impurities and may include a number of holes, whereas the low voltage N-type well region LV NW is doped with N-type impurities and may include a number of electrons. The third gate insulating layer 234 and the third gate electrode 235 are positioned to overlap on the low voltage well 232, and the low voltage well 232 under the third gate insulating layer 234 and the third gate electrode 235 may form a channel region.

The third source region 236 and the third drain region 237 may be formed on both sides of the third gate electrode 235, respectively. In some cases, after the third gate insulating layer 234 and the third gate electrode 235 are formed, a lightly doped drain (LDD) region may be formed. The LDD region may be formed in the vicinity of the third source region 236 and the third drain region 237, and can reduce the leakage current of the low voltage semiconductor element.

Also, in FIG. 3, the low voltage semiconductor element 30 in the third region may include at least one third trench 233. The third trench 233 may be the first trench 213 or the second trench 223 in accordance with a manufacturing process of the semiconductor device. According to one or more embodiments, when the third trench 233 is the same as the first trench 213, a minimum value that is a design standard for the display device can be obtained by reducing the area of the display driver IC. Meanwhile, when the third trench 233 is the same as the second trench 223, there is an effect of reducing a manufacturing process cost, even if the area of the display driver IC increases.

Also, according to one or more embodiments, the third well tab 238 may be formed on a surface of the low voltage well 232 on which the third source and the third drain regions 236 and 237 are not formed. The third well tab 238 may reduce the resistance of the low voltage well 232 and may serve to apply a bias voltage or a ground voltage to the low voltage well 232. The third well tab 238 may have the same conductivity type as that of the low voltage well 232 thereunder and may have a higher impurity doping concentration than that of the low voltage well 232.

In the foregoing, it has been described that the first high voltage semiconductor element 10, the second high voltage semiconductor element 20, and the low voltage semiconductor element 30 are disposed on the semiconductor substrate 200, respectively. However, the present disclosure is not limited thereto, and at least one or two of the first high voltage semiconductor element 10, the second high voltage semiconductor element 20, and the low voltage semiconductor element 30 may be disposed in combination with each other on the semiconductor substrate 200.

Before describing a method for manufacturing the semiconductor device, including the first high voltage semiconductor element 10, the second high voltage semiconductor element 20, and the low voltage semiconductor element 30 proposed in the present disclosure, the cross-sectional view of the semiconductor element and the cross-sectional view of another semiconductor element will be described by comparing them.

Figure 4:
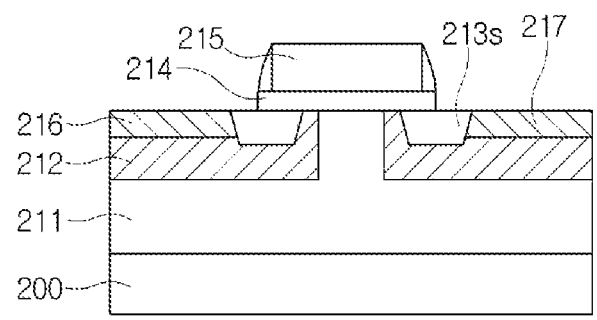
FIG. 4 is a view for describing a first high voltage semiconductor element according to one or more embodiments is compared with a first high voltage semiconductor element according to a comparison example.
Figure 4:
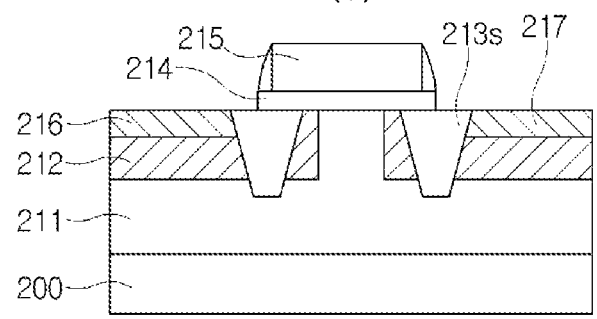
Figure 4:
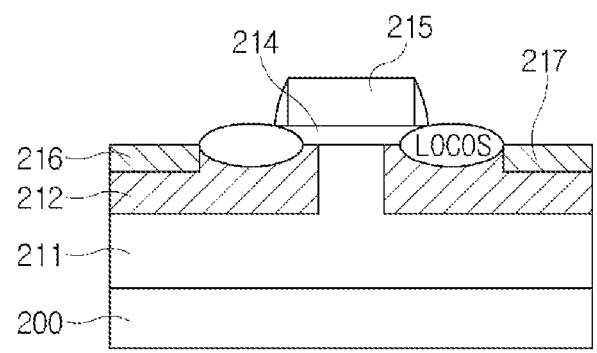

FIG. 4 shows a cross-sectional view of the first high voltage semiconductor element according to one or more embodiments. Specifically, a cross-sectional view of the first high voltage semiconductor element according to one or more embodiments is shown in (a) of FIG. 4, and cross-sectional views of the first high voltage semiconductor element according to a comparison example are shown in (b) and (c) of FIG. 4.

Referring to FIG. 4, a plurality of the first trenches 213s formed in the first high voltage semiconductor element 10 may be formed between the first gate electrode 215 and the first source region 216 and between the first gate electrode 215 and the first drain region 217, and may include the first trench 213s (see (a) of FIG. 4) formed in the first drift region 212. Here, two or more plural first trenches 213s overlapping the first gate electrode 215 are formed. For convenience of description of the structure of the element, the first trench 213s on the left of the two first trenches 213s is referred to as a first shallow trench 213s (left), and the first trench 213s on the right is referred to as a second shallow trench 213s (right). Similarly, two or more plural first drift regions 212 overlapping the first gate electrode 215 are formed. For the convenience of description of the structure of the element, the first drift region 212 on the left of the two first drift regions 212 is referred to as a first deep drift region 212 (left), and the first drift region 212 on the right is referred to as a second deep drift region 212 (right).

In the direction of the first source region 216, the first gate insulating layer 214 and the first gate electrode 215 are formed to overlap the first shallow trench 213s (left) and the first deep drift region 212 (left). Therefore, the first gate insulating layer 214 may be formed in direct contact with the first shallow trench 213s (left) and the first deep drift region 212 (left).

Similarly, in the direction of the first drain region 217, the first gate insulating layer 214 and the first gate electrode 215 are formed to overlap the second shallow trench 213s (right) and the second deep drift region 212 (right). Thus, the first gate insulating layer 214 may be formed in direct contact with the second shallow trench 213s (right) and the second deep drift region 212 (right).

As mentioned above, the first shallow trench 213s (left) may be formed between the first source region 216 and the first gate electrode 215. Also, the second shallow trench 213s (right) may be formed between the first drain region 217 and the first gate electrode 215. Since the first high voltage semiconductor element 10 operates at 40 V or higher, the first and second shallow trenches 213s may be required between the first source region 216 and the first gate electrode 215 and between the first drain region 217 and the first gate electrode 215 in order to protect the first thin gate insulating layer 214.

In order for the first high voltage semiconductor element 10 to operate normally, the depth of the first trench 213s must be smaller than the depth of the first drift region 212. If the first trench 213s has a greater depth, the first trench 213s is not able to function as an element.

For example, when the first trench 213s has the same depth as that of the second trench 223 of the first high voltage semiconductor element 10 (see (b) of FIG. 4), the depth of the first trench 213s is, as described above, greater than the depth of the first drift region 212, there is a problem that current cannot flow.

Also, instead of the first trench 213s, a local oxidation of silicon (LOCOS) type isolation layer (see (c) of FIG. 4) can be used. However, in this case, there is a disadvantage in that the area of the chip is increased. Therefore, it may be desirable to form the first trench 213s having a first depth (see (a) of FIG. 4) around a region in which a gate drive element is formed in the region of the first high voltage semiconductor element 10.

Figure 5:
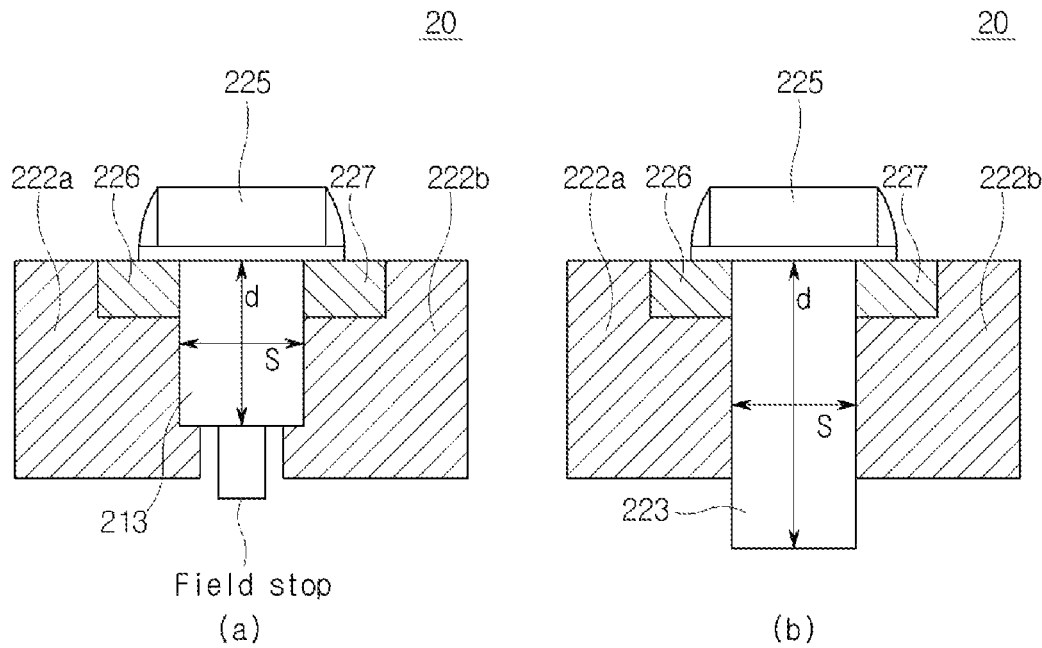
FIGS. 5 and 6 are views for describing a second high voltage semiconductor element according to another embodiment is compared with a second high voltage semiconductor element according to a comparison example.

FIG. 5 shows a cross-sectional view of the second high voltage semiconductor element according to another embodiment.

For reference, as shown in FIG. 5, in the second high voltage semiconductor element, the second gate insulating layer and the second gate electrode may be formed on the second trench. That is, the second trench may be formed between the second source region and the second drain region. However, this structure is not limited to the second high voltage semiconductor element, and can also be applied to the first high voltage semiconductor element.

Specifically, a cross-sectional view of the second high voltage semiconductor element according to a comparison example is shown in (a) of FIG. 5, and a cross-sectional view of the second high voltage semiconductor element according to another embodiment is shown in (b) of FIG. 5.

Referring to (a) of FIG. 5, when the first trench 213 having the first depth is applied to the second high voltage semiconductor element 20 in the second region, the second drift regions 222a and 222b may be formed to extend further than the depth of the first trench 213. In this case, ion implantation photo alignment is required to form the second drift regions 222a and 222b.

Also, in a field poly-silicon gate structure in which the gate electrode 225 is formed on a field insulating layer. The first trench 213 stops a channeling of electrons between the second drift regions 222a and 222b. However, the depth d of the first trench 213 is small, the channeling of electrons can be easily occured. In order to stop the channeling, a field stop (F/S) implant may be required. Therefore, not only a photo align margin but also more space, that is, a long field space S is required.

Compared with this, referring to (b) of FIG. 5, when the second trench 223 having a second depth is applied to the second high voltage semiconductor element 20 in the second region. The second trench 223 stops a channeling of electrons between the second drift regions 222a and 222b. The second drift regions 222a and 222b are shallower than the depth of the second trench 223 and are formed right next to the second trench 223, so it is not required a channel stop ion implantation under the second trench 223.

Also, since the depth "d" from the bottom surface of the second gate electrode 225 to the bottom surface of the second trench 223 is great, the channel cannot be easily excited. Therefore, field stop (F/S) implantation is unnecessary. Therefore, there is no need for photo alignment, and a separate space for forming the field stop (F/S) is not required. Consequently, the field space S may be reduced.

Figure 6:
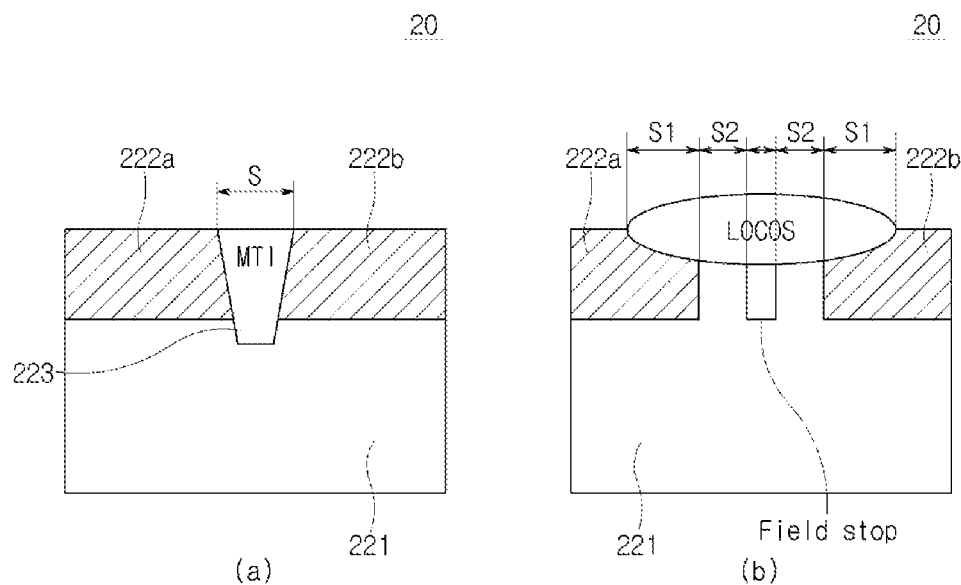

FIG. 6 shows a cross-sectional view of the second high voltage semiconductor element according to another further embodiment. For reference, as shown in FIG. 6, the second trench 223 may be formed between the second drift regions 222a and 222b. However, this structure is not limited to the second high voltage semiconductor element, and may be applied to the first high voltage semiconductor element.

A cross-sectional view of the second high voltage semiconductor element according to further another embodiment is shown in (a) of FIG. 6, and a cross-sectional view of the second high voltage semiconductor element according to a comparison example is shown in (b) of FIG. 6. Referring to (a) of FIG. 6, in the second high voltage semiconductor element 20 that can be used as the source driver IC (SHV element), the isolation between the second drift regions 222a and 222b (SHV drift) that are close to each other is formed by using the second trench 223 (MTI structure).

Referring to (b) of FIG. 6, if LOCOS instead of the second trench 223 (MTI) is used as an isolation layer in the second high voltage semiconductor element 20 that can be used as the source driver IC, isolation design rules S1 and S2 increase significantly. Therefore, as proposed in the present disclosure, it may be desirable to form the isolation layer by using the second trench 223 (MTI) instead of the LOCOS in the source driver IC structure.

Figure 7:
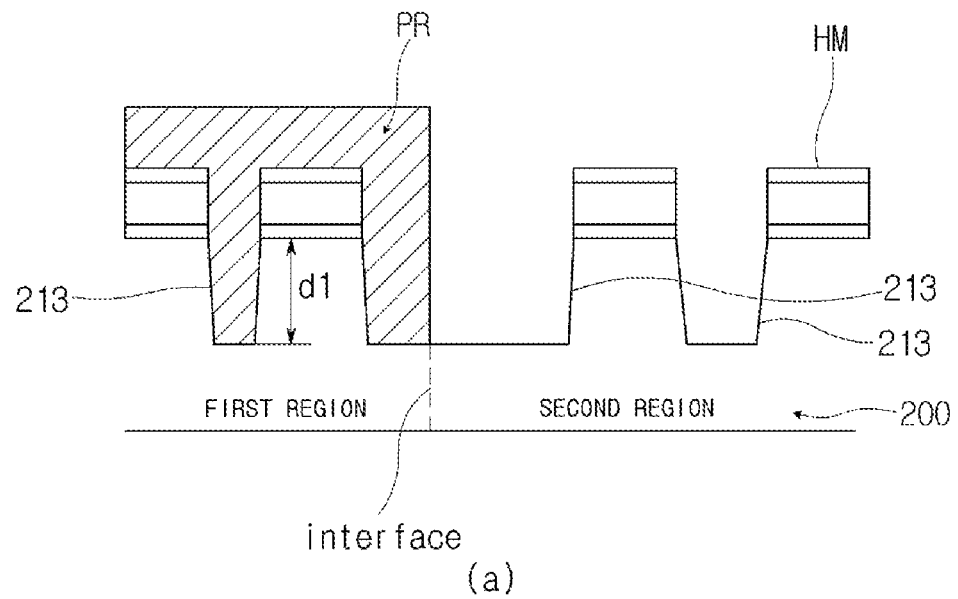
FIG. 7 is a cross-sectional view of a dual depth trench formed in a contact region between the first high voltage semiconductor element and the second high voltage semiconductor element.
Figure 7:
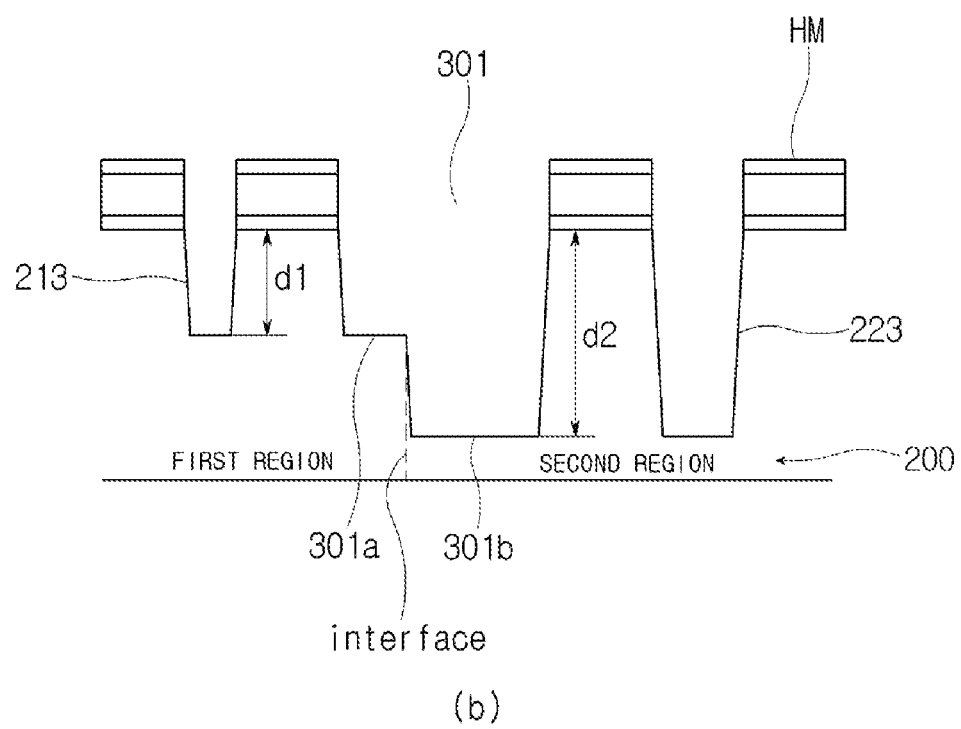

FIG. 7 shows a method for manufacturing an isolation structure between the high voltage semiconductor elements according to one or more embodiments and shows the isolation structure.

Referring to (a) of FIG. 7, the plurality of first trenches 213 having a first depth d1 may be formed in the first region, the second region, and an interface between the first region and the second region. Then, a photo resist (PR) is applied to the first region. The first trench 213 in the first region is covered with the PR. Also, a part of the first trench 213 at the interface is also covered with PR. The remaining first trench 213 is exposed as it is. In this state, the substrate 200 may be additionally etched by using the PR and a hard mask (HM). Here, a layer composed of an oxide layer/nitride layer/oxide layer, or the like may be used as the hard mask (HM).

Referring to (b) of FIG. 7, a dual depth trench 301 having two different depths may be formed at an interface between the first high voltage semiconductor element 10 in the first region and the second high voltage semiconductor element 20 in the second region. The dual depth trench 301 has a structure of a trench 301b having a greater depth d2 as well as a structure of a trench 301a having a smaller depth d1.

Here, the smaller depth d1 is similar to the depth of the first trench 213, and the greater depth d2 is similar to the depth of the second trench 223. By forming in this way, the first high voltage semiconductor element 10 in the first region and the second high voltage semiconductor element 20 in the second region can be well electrically isolated.

Similarly, a dual depth trench 303 having two different depths may be formed at an interface between the second high voltage semiconductor element 20 in the second region and the low voltage semiconductor element 30 in the third region (see FIG. 3). The dual depth trench 303 may have a greater depth as well as a smaller depth. Here, the smaller depth is similar to the depth of the third trench 233, and the greater depth is similar to the depth of the second trench 223. By forming in this way, the second high voltage semiconductor element 20 in the second region and the low voltage semiconductor element in the third region can be well electrically isolated.

Hereinafter, a method for manufacturing a semiconductor device including the first high voltage semiconductor element 10, the second high voltage semiconductor element 20, and the low voltage semiconductor element 30 will be described in detail.

Figure 8:
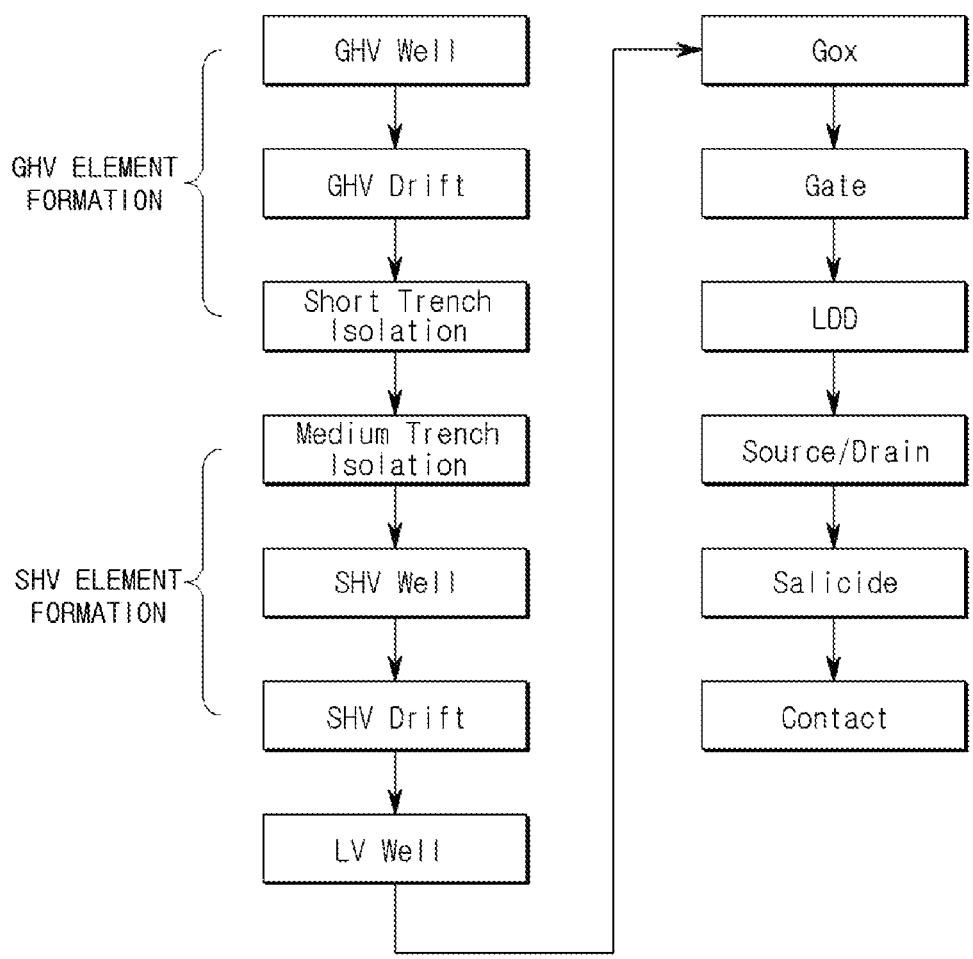
FIG. 8 is a flowchart of a method for manufacturing the semiconductor device according to one or more embodiments.

FIG. 8 is a flowchart of a method for manufacturing the semiconductor device according to one or more embodiments, and FIGS. 9A to 9I show cross-sectional views of the semiconductor device according to FIG. 8, respectively.

Referring to FIG. 8, the first high voltage semiconductor element 10 (GHV element) is formed first, and then the second high voltage semiconductor element 20 (SHV element) is formed. This is because a relatively higher voltage GHV element requires thermal budget by drive-in annealing. If the process sequence is reversed the electrical characteristics of the second high voltage semiconductor element 20 (SHV element) may deteriorate by the high thermal budget induced by the GHV element 10.

Figure 9A:
FIGS. 9A to 9I are cross-sectional views for describing the method for manufacturing the semiconductor device according to one or more embodiments.

Referring to FIGS. 8 and 9A together, the first high voltage well 211, including the high voltage P-type well region GHV PW and the high voltage N-type well region GHV NW can be formed in the first region of the semiconductor substrate 200.

The first high voltage well 211 can be formed by performing the drive-in annealing process that is for diffusing impurities after impurity ion implantation.

According to one or more embodiments, the depth of the first high voltage well 211 may be formed to be greater than the depth of the low voltage deep well 231 or the depth of the second high voltage well 221, which is formed later. This is because a temperature range of the drive-in annealing process performed when the first high voltage well 211 is formed is relatively higher than a temperature range of the drive-in annealing process performed when the second high voltage well 221 or the low voltage deep well 231 is formed.

Figure 9B:
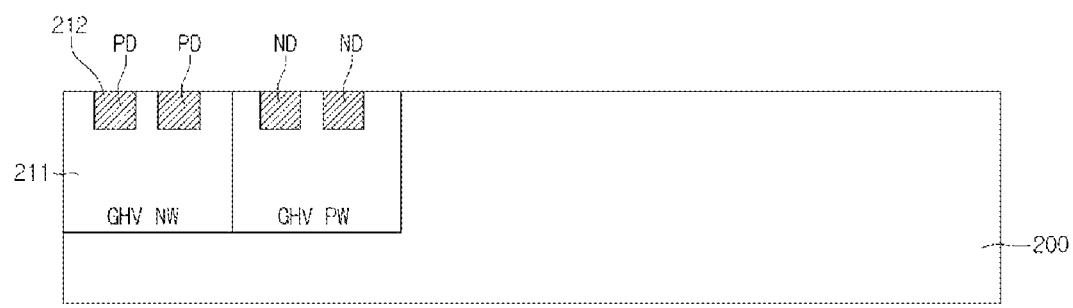

Next, referring to FIGS. 8 and 9B together, the plurality of first drift regions 212 for mitigating the electric field of the high concentration doped region may be formed in the first high voltage well 211. The first drift region 212 can be formed by performing the drive-in annealing process that is for diffusing impurities after N-type or P-type impurity ion implantation. For example, a pair of N-type low concentration first drift regions 212 (ND) may be formed in the high voltage P-type well region GHV PW, and in contrast, another pair of P-type low concentration first drift region 212 (PD) may be formed in the high voltage N-type well region GHV NW.

Figure 9C:
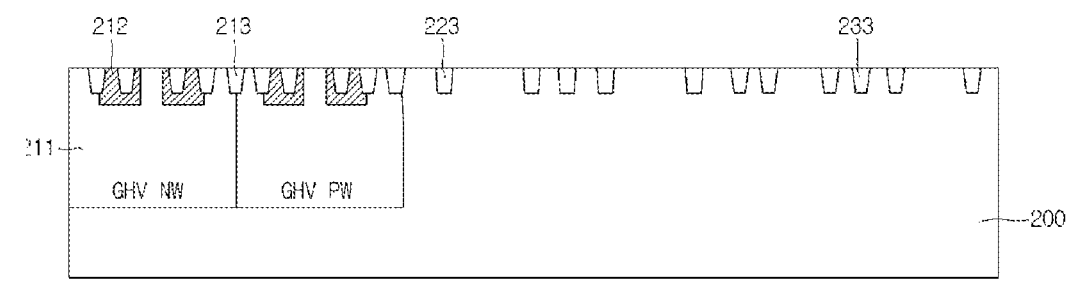

Next, referring to FIGS. 8 and 9C together, short trench isolation (STI) 213, 223 and 233 for the isolation between the semiconductor elements can be formed by etching the semiconductor substrate 200.

As a process of manufacturing the STI, the semiconductor substrate 200 is deposited with any one single layer selected from the group consisting of an oxide layer, a nitride layer, an oxynitride layer, and a carbon-containing layer, or a multilayer formed by stacking them, and is covered with a photoresist (not shown). Then the photoresist may be patterned through exposure and development processes. Subsequently, the single layer or the multilayer layer is sequentially etched by using the patterned photoresist as a mask, thereby forming a hard mask pattern (not shown). After the hard mask pattern is formed, the photoresist may be removed by an ashing or stripping process.

Through this manufacturing process, the first trench 213, the second trench 223, and the third trench 233 having the STI structure can be simultaneously formed in the first, second, and third regions of the semiconductor substrate 200. That is, the STI can be simultaneously formed in the first, second, and third regions in which the first high voltage semiconductor element 10, the second high voltage semiconductor element 20, and the low voltage semiconductor element 30 are formed.

Figure 9D:
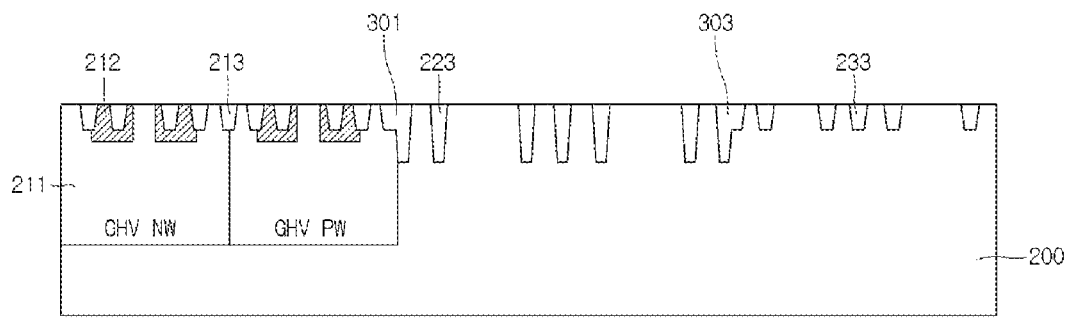

Next, referring to FIGS. 8 and 9D together, the second trench 223 having the medium trench isolation (MTI) structure can be formed by additionally etching the STI formed in the semiconductor substrate 200 in the second region. According to one or more embodiments, the MTI structure can be formed by additionally etching the STI by additionally performing a process the same as or similar to the process of FIG. 9C. Accordingly, the depth of the second trench 223 having the MTI structure may be formed to be greater than the depth of the first trench 213 having the STI structure. Also, as described above with reference to FIG. 7, the dual depth trenches 301 and 303 may be formed between the first high voltage semiconductor element 10, the second high voltage semiconductor element 20, and the low voltage semiconductor element 30.

According to one or more embodiments, the second trench 223 may be formed in a region where isolation between components is required in the second region and may be formed in an interface region which is in contact with the first high voltage semiconductor element 10 or the low voltage semiconductor element 30. The second trench 223 may serve to electrically isolate the semiconductor elements having different operating voltages.

Figure 9E:
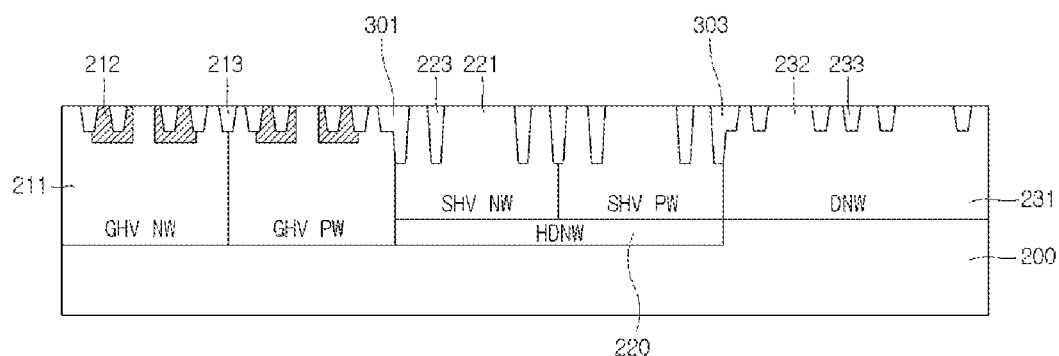
Figure 9F:
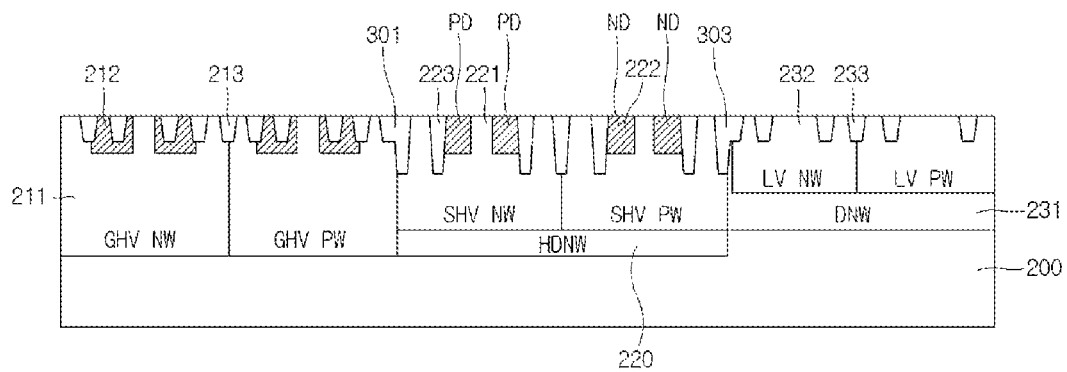

Next, referring to FIGS. 8 and 9E together, the high voltage N-type deep well region 220 HDNW may be formed in the second region of the semiconductor substrate 200, and the second high voltage well 221 including the high voltage P-type well region SHV PW and the high voltage N-type well region SHV NW may be formed on the high voltage N-type deep well region 220 HDNW. Also, the low voltage deep well DNW 231 may be formed in the third region. The high voltage N-type deep well region 220 HDNW, the second high voltage well 221, and the low voltage deep well DNW 231 can be formed respectively by performing the drive-in annealing process that is for diffusing impurities after impurity ion implantation. The low voltage deep well DNW 231 may block a noise from the first high voltage semiconductor element into the low voltage semiconductor element 30, and can be formed by implanting ions of a specific conductivity type.

Next, referring to Fogs. 8 and 9F together, the plurality of second drift regions 222 for mitigating the electric field of the high concentration doped region may be formed in the second high voltage well 221. Unlike the first drift region 212, the second drift region 222 can be formed by implanting N-type or P-type impurity ions without the drive-in annealing process. For example, a pair of N-type low concentration second drift regions 222 (ND) may be formed in the high voltage P-type well region SHV PW, and in contrast, another pair of P-type low concentration second drift region 222 (PD) may be formed in the high voltage N-type well region SHV NW.

Also, the low voltage well 232, including the low voltage P-type well region LV PW and the low voltage N-type well region LV NW may be formed in the low voltage deep well 231. Unlike the first high voltage well 211 or the second high voltage well 221, the low voltage well 232 may also be formed by implanting N-type or P-type impurity ions without the drive-in annealing process.

Figure 9G:
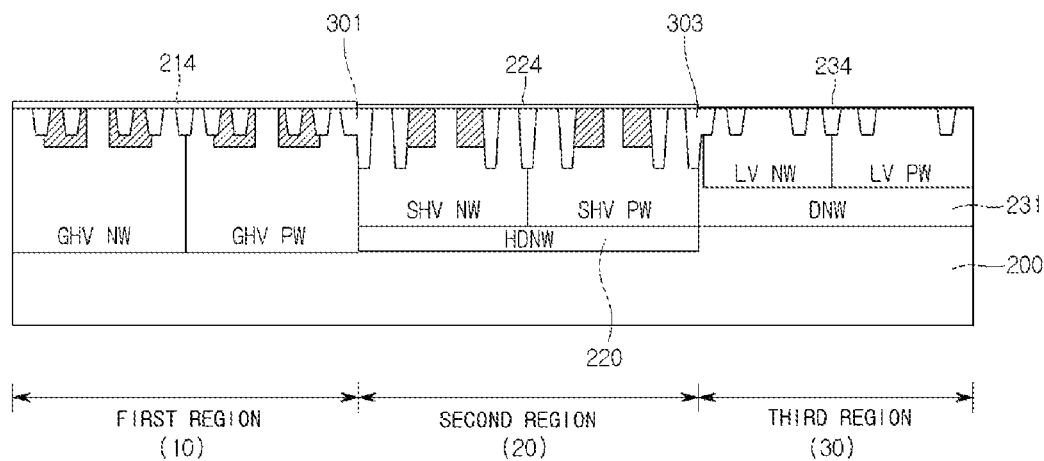

Next, referring to FIGS. 8 and 9G together, the gate insulating layer (or a gate oxide) may be formed on the semiconductor substrate 200. The gate insulating layer may include the first gate insulating layer 214 formed in the first region, the second gate insulating layer 224 formed in the second region, and the third gate insulating layer 234 formed in the third region.

According to one or more embodiments, the first to third gate insulating layers 214, 224, and 234 may have a stepped gate insulating layer structure. Thus, the first to third gate insulating layers 214, 224, and 234 may have different thicknesses from each other.

For example, the third gate insulating layer 234 may have a thickness of 5 nm or less, while the first gate insulating layer 214 or the second gate insulating layer 224 may have a thickness in the range of 30 nm to 70 nm. That is, the third gate insulating layer 234 formed on the low voltage semiconductor element 30 may have a thickness less than the thickness of the first and second gate insulating layers 214 and 224 formed on the first and second high voltage semiconductor elements 10 and 20.

Figure 9H:
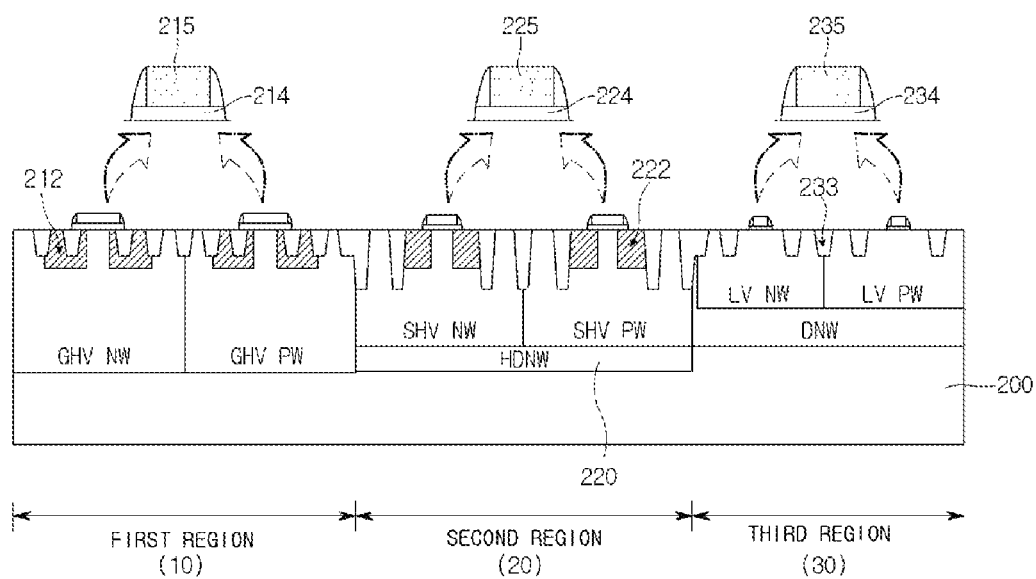

Next, referring to FIGS. 8 and 9H together, after the first to third gate insulating layers 214, 224, and 234 are formed, a conductive material is deposited and patterned on the gate insulating layer (or gate oxide), so that the first to third gate electrodes 215, 225, and 235 can be formed on the first to third regions of the semiconductor substrate 200.

For example, the first gate insulating layer 214 and the first gate electrode 215 may be positioned between the plurality of first drift regions 212 in the first region, and the second gate insulating layer 224 and the second gate electrode 225 may be positioned between the plurality of second drift regions 222 in the second region. The third gate insulating layer 234 and the third gate electrode 235 may be positioned between the plurality of third trenches 233 formed in the third region.

According to one or more embodiments, a gate spacer made of an oxide film or a nitride film may be formed on both side surfaces of each of the first to third gate electrodes 215, 225, and 235. In this case, the lightly doped drain (LDD) region for preventing leakage current of each semiconductor element may be formed under the gate spacer of the first to third gate electrodes 215, 225, and 235.

Figure 9I:
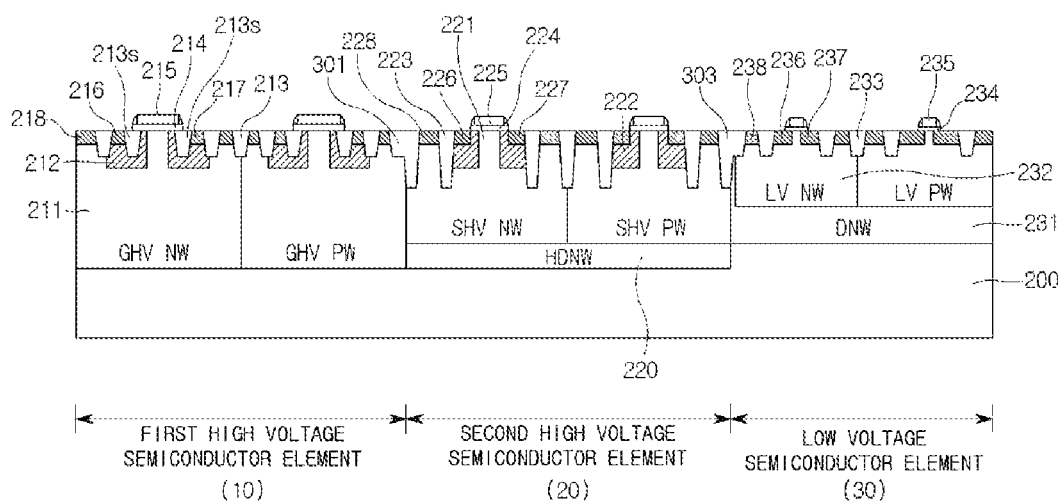

Next, referring to FIGS. 8 and 9I together, the first to third source regions 216, 226, and 236, and the first to third drain regions 217, 227, and 237 can be formed respectively by implanting impurity ions into both sides of the first to third gate electrodes 215, 225, and 235. For example, the first source region 216 and the first drain region 217 may be formed on the first drift region 212, and the second source region 226 and the second drain region 227 may be formed on the drift region 222. The third source region 236 and the third drain region 237 may be formed in the low voltage well 232.

Subsequently, silicide may be formed on the semiconductor substrate 200. Through this, the first high voltage semiconductor element 10, the second high voltage semiconductor element 20, and the low voltage semiconductor element 30 can be formed in a single process, respectively.

Figure 10:
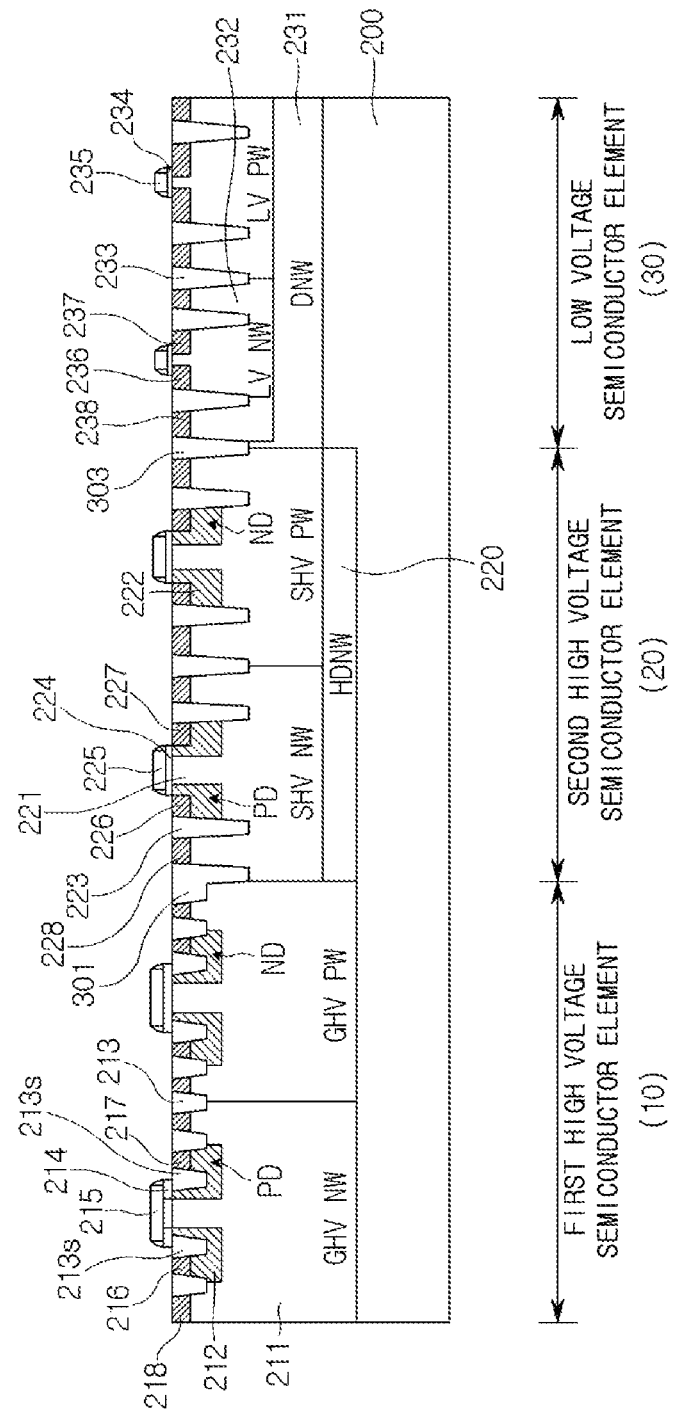
FIG. 10 is a cross-sectional view of a semiconductor device according to another embodiment.

FIG. 10 is a cross-sectional view of the semiconductor device according to another embodiment.

The semiconductor device shown in FIG. 10 corresponds to an additional embodiment of the semiconductor device of FIG. 3. Since the semiconductor device can be formed through the same components and the same process as those of the semiconductor manufacturing method of FIGS. 8 to 9I, a detailed description thereof will be omitted. Hereinafter, only differences between one or more embodiments will be described in detail.

Referring to FIG. 10, the low voltage semiconductor element 30 in the third region may include at least one third trench 233. While the third trench 233 of one or more embodiments of FIG. 3 has the STI structure, the third trench 233 of one or more embodiments of FIG. 10 may have the MTI structure. At a time when the first trench 213 in the first region is formed, the third trench 233 and the second trench 223 are formed in the STI structure in the same manner as the first trench 213, and then the third trench 233 and the second trench 223 may be formed by performing an additional process.

For example, when the third trench 233 of the low voltage semiconductor element 30 has the STI structure (for example, see FIG. 3), while a minimum value that is a design standard for the display device can be obtained by reducing the area of the display driver IC, there is an effect of reducing a manufacturing process cost when the third trench 233 of the low voltage semiconductor element 30 has the MTI structure (for example, see FIG. 10). Therefore, according to the manufacturing process of the semiconductor device, the third trench 233 of the low voltage semiconductor element 30 in the third region may have the STI structure or the MTI structure.

Various embodiments relate to a display driver semiconductor device and a method for manufacturing the same, and to a semiconductor device that integrates a semiconductor element for a source driver and a semiconductor element for a gate driver in a single process and converts a display driver IC into one chip, and a method for manufacturing the same.

The purpose of the present disclosure is to overcome the aforementioned problems and is to provide a semiconductor device that integrates a semiconductor element for a source driver and a semiconductor element for a gate driver in a single process and converts a display driver IC into one chip, and a method for manufacturing the same.

The technical problem to be overcome in this document is not limited to the above-mentioned technical problems. Other technical problems not mentioned can be clearly understood from those described below by a person having ordinary skill in the art.

According to the semiconductor device and a method for manufacturing the same according to various embodiments of the present disclosure, it is possible to integrate a semiconductor element for a source driver and a semiconductor element for a gate driver in a single process and to convert a display driver IC into one chip.

Also, according to the semiconductor device and the method for manufacturing the same according to various embodiments of the present disclosure, the display driver IC is converted into one chip, so that the package cost of the driver IC is reduced and the size of the bezel of the display device is reduced, and thus, the display area of the display device can be expanded.

As described above, according to the semiconductor device and the method for manufacturing the same according to various embodiments, the semiconductor element for the source driver and the semiconductor element for the gate driver are integrated in a single process, thereby converting the display driver IC into one chip.

Also, according to the semiconductor device and the method for manufacturing the same according to various embodiments, the display driver IC is converted into one chip, so that the package cost of the driver IC is reduced and the size of the bezel of the display device is reduced, and thus, the display area of the display device can be expanded.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
   a first high voltage semiconductor element, disposed in a substrate, comprising:
      first trenches disposed in the substrate;
      a first source region and a first drain region;
      first drift regions having respective ones partially surround the first source region and the first drain region;
      a first gate insulating layer and a first gate electrode disposed between the first drift regions; and
      a first high voltage well surrounding the first drift regions; and
   a second high voltage semiconductor element, disposed in the substrate, comprising:
      second trenches disposed in the substrate;
      a second source region and a second drain region;
      second drift regions having respective ones partially surround the second source region and the second drain region;
      a second gate insulating layer and a second gate electrode disposed between the second drift regions; and
      a second high voltage well surrounding the second drift regions,
   wherein a depth of a second trench of the second trenches is greater than a depth of a first trench of the first trenches.

2. The semiconductor device of claim 1,
   wherein a gate driver IC comprises the first high voltage semiconductor element,
   a source driver IC comprises the second high voltage semiconductor element, and
   the gate driver IC and the source driver IC are formed as one chip.

3. The semiconductor device of claim 1,
wherein a dual depth trench, having a first depth and a second depth, is disposed in a contact region between the first high voltage semiconductor element and the second high voltage semiconductor element,
the first depth and the depth of the first trench are equal, and
the second depth and the depth of the second trench are equal.

4. The semiconductor device of claim 1,
wherein the first trenches comprise a first shallow trench and a second shallow trench overlapping the first gate electrode,
the first shallow trench is disposed between the first source region and the first gate electrode,
the second shallow trench is disposed between the first drain region and the first gate electrode, and
the depth of the first trench is shallower than a depth of the first drift region.

5. The semiconductor device of claim 1,
wherein the second trenches surround the second drift regions, and the depth of the second trench is greater than a depth of the second drift region.

6. The semiconductor device of claim 1,
wherein a depth of the first high voltage well is greater than a depth of the second high voltage well, and a thickness of the first gate insulating layer is greater than a thickness of the second gate insulating layer.

7. The semiconductor device of claim 1,
wherein the second high voltage semiconductor element further comprises a high voltage deep well under the second high voltage well.

8. The semiconductor device of claim 1,
wherein the first trenches comprise a first shallow trench and a second shallow trench overlapping the first gate electrode, the first shallow trench is disposed between the first source region and the first gate electrode, the second shallow trench is disposed between the first drain region and the first gate electrode, and
wherein the first drift regions comprise a first deep drift region and a second deep drift region overlapping the first gate electrode, the first deep drift region partially surrounds the first source region and the first shallow trench, and the second deep drift region partially surrounds the first drain region and the second shallow trench.

9. The semiconductor device of claim 1, further comprising a low voltage semiconductor element disposed on the substrate,
wherein the low voltage semiconductor element comprises:
a third source region and a third drain region disposed in the substrate;
a third gate insulating layer and a third gate electrode disposed between the third source region and the third drain region;
a low voltage well partially surrounding the third source region and the third drain region; and
third trenches disposed in the substrate, and
wherein a depth of a third trench of the third trenches is shallower than the depth of the second trench, and equal to the depth of the first trench.

10. The semiconductor device of claim 9,
wherein a dual depth trench, having a first depth and a second depth, is disposed in a contact region between the second high voltage semiconductor element and the low voltage semiconductor element, and
wherein the first depth is equal to the depth of the third trench, and the second depth is equal to the depth of the second trench.

11. The semiconductor device of claim 1,
wherein the first trenches comprise a first shallow trench and a second shallow trench overlapping the first gate electrode,
the first drift regions comprise a first deep drift region and a second deep drift region overlapping the first gate electrode,
one side of the first gate electrode overlaps the first shallow trench and the first deep drift region, and
another side of the first gate electrode overlaps the second shallow trench and the second deep drift region.

12. The semiconductor device of claim 11,
wherein one side of the first gate insulating layer is disposed in direct contact with the first shallow trench and the first deep drift region, and
another side of the first gate insulating layer is disposed in direct contact with the second shallow trench and the second deep drift region.

13. A method for manufacturing a semiconductor device, the method comprising:
forming a first high voltage well in a first region of a substrate;
forming first drift regions in the first high voltage well;
forming first trenches in the first drift regions;
forming, in a second region of the substrate, second trenches with depths greater than depths of the first trenches;
forming a second high voltage well in the second region;
forming second drift regions in the second high voltage well;
forming first and second gate insulating layers on the first and second high voltage wells, respectively;
forming first and second gate electrodes on the first and second gate insulating layers, respectively;
forming a first source region and a first drain region on corresponding ones of the first drift regions; and
forming a second source region and a second drain region on corresponding ones of the second drift regions.

14. The method of claim 13,
wherein a gate driver IC comprises a first high voltage semiconductor element disposed in the first region,
a source driver IC comprises a second high voltage semiconductor element disposed in the second region, and
the gate driver IC and the source driver IC are disposed as one chip.

15. The method of claim 13,
wherein a dual depth trench, having a first depth and a second depth, is disposed in a contact region between the first region and the second region,
the first depth and the depth of the first trench are equal, and
the second depth and the depth of the second trench are equal.

16. The method of claim 13, wherein a depth of the first high voltage well is greater than a depth of the second high voltage well.

17. The method of claim 13, further comprising forming a high voltage deep well before the forming of the second high voltage well.

18. The method of claim 13, further comprising forming a low voltage semiconductor element on the substrate,
wherein the forming a low voltage semiconductor element comprises:

forming third trenches in the substrate;
forming a low voltage well in the substrate;
forming a third gate insulating layer and a third gate electrode on the low voltage well; and
forming a third source region and a third drain region in the low voltage well, and wherein depths of the third trenches are shallower than the depths of the second trenches.

19. The method of claim 13,
wherein the first trenches comprise a first shallow trench and a second shallow trench overlapping the first gate electrode,
the first drift regions comprise a first deep drift region and a second deep drift region overlapping the first gate electrode,
one side of the first gate electrode overlaps the first shallow trench and the first deep drift region, and
another side of the first gate electrode overlaps the second shallow trench and the second deep drift region.

20. The method of claim 19,
wherein one side of the first gate insulating layer is disposed in direct contact with the first shallow trench and the first deep drift region, and
another side of the first gate insulating layer is disposed in direct contact with the second shallow trench and the second deep drift region.

21. A semiconductor device, comprising:
semiconductor elements, serially disposed in a substrate, each comprising:
a source region adjacently disposed to a drain region;
a gate insulating layer disposed on each of the semiconductor elements;
a gate electrode disposed on the gate insulating layer;
trenches disposed in each of the semiconductor elements; and
first drift regions in a first semiconductor element of the semiconductor elements,
wherein the first drift regions have respective ones partially surround the source region and the drain region of the first semiconductor element, and
wherein the trenches in adjacent ones of the semiconductor elements have different depths.

22. The semiconductor device of claim 21, wherein voltages of the semiconductor elements are different from each other.

23. The semiconductor device of claim 21, further comprising second drift regions in a second semiconductor element of the semiconductor elements,
wherein the second drift regions have respective ones partially surrounding the source region and the drain region of the second semiconductor element.

24. The semiconductor device of claim 21, wherein the gate insulating layer of the first semiconductor element overlaps the trenches in the first semiconductor element.

25. The semiconductor device of claim 23, wherein the gate insulating layer of the second semiconductor element is disposed between the trenches in the second semiconductor element.

* * * * *